United States Patent [19]

Vardiman

[11] Patent Number: 4,568,396

[45] Date of Patent: Feb. 4, 1986

[54] WEAR IMPROVEMENT IN TITANIUM ALLOYS BY ION IMPLANTATION

[75] Inventor: Ronald G. Vardiman, Alexandria, Va.

[73] Assignee: The United States of America as represented by the Secretary of the Navy, Washington, D.C.

[21] Appl. No.: 657,115

[22] Filed: Oct. 3, 1984

[51] Int. Cl.$^4$ ............................................. C23C 11/10
[52] U.S. Cl. ...................................... 148/133; 148/39; 148/421
[58] Field of Search ...................... 148/133, 4, 203, 39, 148/31.5, 421, 16.6; 204/192 N

[56] References Cited

U.S. PATENT DOCUMENTS

| | | | |
|---|---|---|---|
| 4,181,590 | 1/1980 | Fujishiro et al. | 204/192 N |
| 4,289,544 | 9/1981 | Dearnaley | 148/4 |
| 4,346,123 | 8/1982 | Kaufman | 204/192 N |
| 4,465,524 | 8/1984 | Dearnalay et al. | 148/4 |
| 4,490,190 | 12/1984 | Speri | 148/4 |

FOREIGN PATENT DOCUMENTS 0096045  5/1972  France ................................ 148/133

OTHER PUBLICATIONS

A. Grill, "Ion Beam Nitriding of Titanium and Titanium Alloy", Vacuum, vol. 33, No. 6, pp. 333–337, 1/(1983).

Primary Examiner—L. Dewayne Rutledge
Assistant Examiner—S. Kastler
Attorney, Agent, or Firm—Robert F. Beers; William T. Ellis; Ansel M. Schwartz

[57] ABSTRACT

A method of making titanium alloy more resistant to sliding wear and fretting fatigue comprising the steps of: implanting carbon ions with at least one energy onto titanium alloy until at least $1 \times 10^{17}$ carbon ions/cm$^2$ have fallen onto the titanium alloy, said energy level of carbon ions being implanted being greater than 10 KeV. A second method comprises an additional step of heating the implanted titanium alloy to between 300° C. and 500° C. for 0.5 hours to 2 hours. The second method has a lower number of carbon ions/cm$^2$ implanted onto the titanium.

7 Claims, 1 Drawing Figure

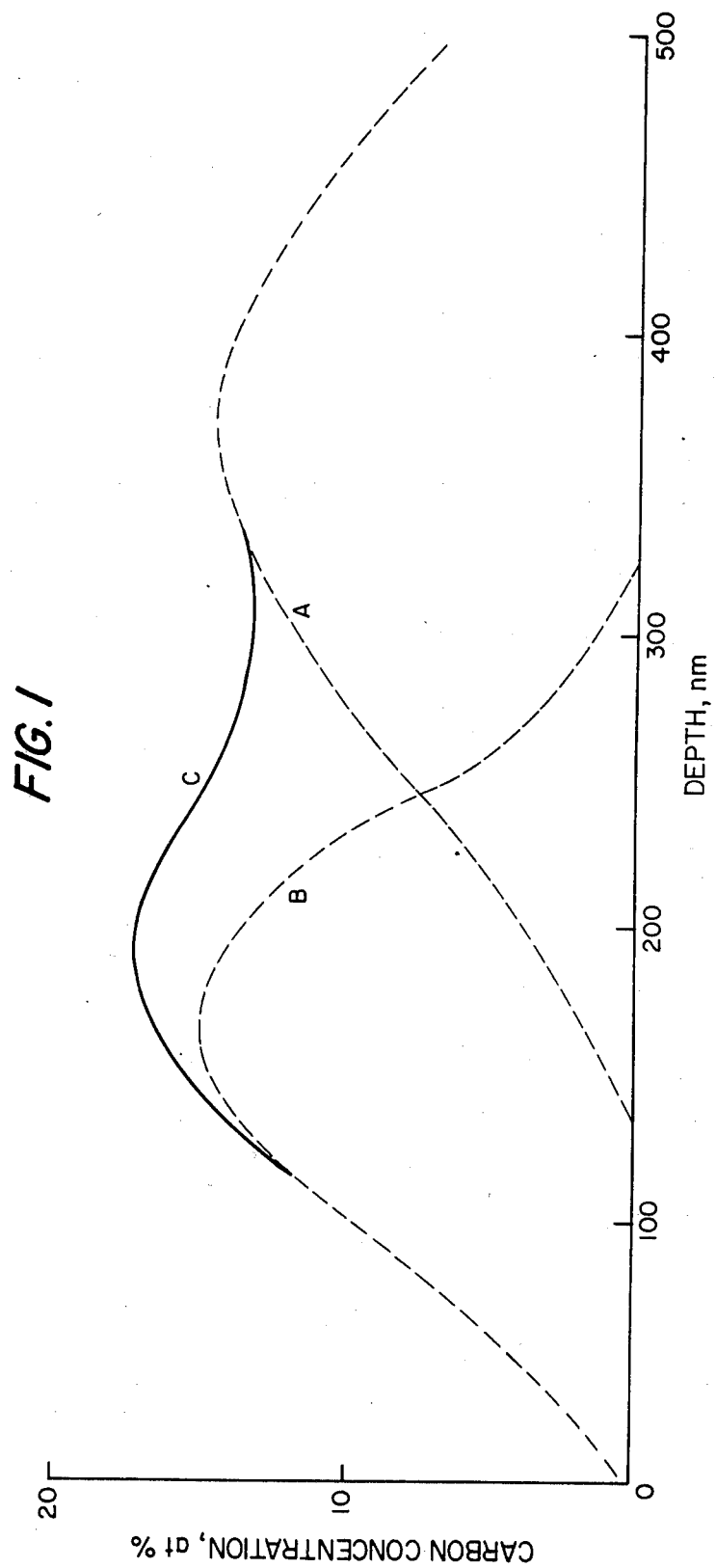

WEAR IMPROVEMENT IN TITANIUM ALLOYS BY ION IMPLANTATION

BACKGROUND OF THE INVENTION

The present invention relates to wear improvement in Titanium alloys. More specifically the present invention describes a process where titanium alloy is made better resistant to sliding wear and fretting fatigue.

Titanium alloys are particularly subject to problems of galling and wear. Their service life can be drastically reduced when sliding or fretting is present. Various coatings have been tried to alleviate this situation. However, many standard coatings such as platings or plasma sprayed coatings do not adhere adequately to titanium. All coatings have the disadvantage of changing the dimension of the part. This can require further finishing, and may be unacceptable for some applications. Ion implantation has the advantage of eliminating adhesion problems and requiring no further finishing. While ion implantation has improved wear resistance in steel, direct ion implantation of titanium alloys has heretofore failed to give an adequate degree of protection.

SUMMARY OF THE INVENTION

Accordingly, one subject of this invention is to provide a novel method for making titanium alloys more resistant to sliding wear and fretting fatigue than heretofor known.

Another object of this invention is to provide a novel method for making titanium alloys more resistant to sliding wear and fretting fatigue by ion implantation of carbon atoms at dual energies and subsequent heating.

Another object of this invention is to provide a novel method for making titanium alloys more resistant to sliding wear and fretting fatigue by ion implantation at dual energies and high levels of carbon atoms per unit area.

Briefly the above and other objects are realized by the method of the present invention comprising the steps of:

implanting carbon ions at a first energy level which is greater than 10 KeV onto a titanium alloy until at least $1 \times 10^{17}$ carbon ions/cm$^2$ has fallen onto the titanium alloy; and implanting carbon ions with at least a second energy level, which is greater than 10 KeV, having a minimum of 20 KeV difference from the first energy level onto the titanium alloy that has been implanted at the first energy level.

Another embodiment further includes the steps of: placing the titanium alloy which has been implanted with carbon ions with at least two energy levels having a 20 KeV difference into an ultra-high vacuum furnace; evacuating the vacuum furnace; and heating the implanted titanium alloy in the vacuum furnace at a temperature of between 300° C. to 500° C. for a period of time between 0.5 hours and 2 hours.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1 is a graph showing the amount of carbon per depth of titanium alloy.

DESCRIPTION OF THE PREFERRED EMBODIMENT

A method for greatly improving the resistance of titanium alloys to sliding wear and fretting fatigue will now be described.

A titanium alloy sample is obtained and placed inside an ion implanter. Carbon monoxide is used as the source of the plasma in the ion implanter that ultimately provides the carbon ions that are implanted in the titanium alloy sample. A standard ion implantation technique is used. It should be noted that the titanium alloy sample should be positioned in the ion implantation so it is well heat sunk.

Once the titanium alloy is in place, a first pure carbon ion beam generated by an ion implanter is aimed onto the titanium alloy sample. The process of ion implantion, using an ion implanter, is well known. In a typical implanter, a chamber holds a source gas, here carbon monoxide, wherein the source gas is ionized thus producing a plasma. As the ions are formed they are continuously extracted through electrical charge attraction and are accelerated through a voltage difference V. This gives each ion an energy $E=qV$, where q is the charge of the ion. Typical acceleration voltages are 10,000 to 500,000 V. The ion beam is then passed through a transverse magnetic field so that the different mass ions of energy E will be deflected by different angles, and in this way ions of particular energy and mass are selected. Here, only carbon ions will be retained. Varying electric fields are often used to sweep the selected ion beam laterally so that an area can be uniformly implanted with the ions. The region between the ion source and the solid target is kept under vacuum since the ions would travel only very short distances in air. The total number of ions incident on the target is determined by measuring the current to the sample during ion implantation. By integrating this current to obtain the total ion charge and using the known charge per ion, the number of ions implanted in the target can be precisely controlled.

The carbon ion beam, for example, implants $3 \times 10^{17}$ carbon ions/cm$^2$ at an energy of 175 KeV. The resultant distribution of carbon in the titanium alloy as a function of depth is shown in the accompanying FIG. 1 by line A. A second beam at a different energy than the first is then aimed onto the titanium alloy sample. The second beam, for example, implants $2 \times 10^{17}$ carbon ions/cm$^2$ at an energy of 5 KeV. The resultant distribution of carbon in the titanium alloy as a function of depth is shown by line B of FIG. 1. The current of the beams that are aimed onto the titanium sample is usually between 5 to 10 microamps but can be less than or greater than this range. The lower the current the longer the beams must be maintained in order to reach the desired number of carbon ions per centimeter squared. One consequence of using a higher current is heating of the titanium sample. If a high current is used, the titanium sample should not be allowed to reach a temperature greater than 500° C. By properly heat sinking the titanium sample, as mentioned earlier, a temperature above 150° C. is rarely attained.

The resultant distribution of carbon from the two energies in the titanium sample as a function of depth is shown by line C of FIG. 1. The level of carbon represented by line C is a superposition of the level of carbon represented by lines A and B. Thus, by using carbon beams at two different energy levels a more uniform distribution of carbon across a greater depth of titanium is attained.

After the ion implantation phase is completed the titanium alloy is placed in an ultra high vacuum furnace. The vacuum furnace is then exhausted to about, for example, $2 \times 10^{-9}$ Torr while cold. The vacuum environment is necessary during the heating phase in order to prevent oxygen from combining with the implanted carbon and contaminating the titanium alloy sample, thus weakening the overall structure.

The furnace containing the titanium sample is brought to a high temperature, for instance, of about 400° C. for about 1 hour, after which the titanium sample is cooled. During the heating step the all important titanium carbide precipitates form and grow in the implanted layer. The titanium carbide precipitates in the titanium alloy give the sample the strength that causes the improved protection against sliding wear and fretting fatigue.

The implanted layer has a sparse distribution of TiC precipitates with a maximum size of 10 nm. Heating at 300° C. for about 1 hour causes a denser distribution of precipitates having a maximum size of 20 nm. Heating the titanium sample at 400° C. for 1 hour produces a large change from the original implanted state, with the maximum precipitate size increasing to 60 nm with few particles of the 10 to 20 nm size present, and retaining a dense distribution. After heat treatment of the TiC sample at 500° C. for 1 hour the number of precipitates greatly diminishes while the individual precipitates are typically of the size 0.5 to 2.0 m. The optimal size and distribution of TiC precipitates occurs when the implanted titanium sample is heated for 1 hour at 400° C. The increased resistance to sliding wear and fretting fatigue is related to the uniformity throughout the implanted layer of the distribution of TiC precipates with optimal size.

The reason ion implantation is utilized is to provide carbon to the titanium. Titanium normally holds only a small amount of carbon. Ion implantation causes more carbon to enter the titanium than equilibrium conditions would allow and creates a non-equilibrium situation. When the heating occurs, the higher than normal amounts of carbon in the titanium try and reach equilibrium causing more precipitates of TiC to form.

Another method of creating the all important TiC precipitates in the titanium at acceptable density, sizes and depths is to implant carbon ions at two energies at a greater level of carbon ions/cm$^2$. By following this method the heating phase described above can be omitted.

In the second method for making titanium more resistant to sliding wear and fretting fatigue, the titanium sample is placed into the ion implanter exactly as before. When implantation starts all that is necessary to achieve the desirable precipitate conditions is to maintain the ion beam for a longer period of time. The first energy can be, for instance. 175 KeV with a current, for example, at 20 microamps being maintained until $10 \times 10^{17}$ carbon ions/cm$^2$ are implanted. The peak amount of carbon will occur at the same depth in the titanium alloy as will occur when a lower level of carbon ions/cm$^2$ is used and the half width of the curve for both current levels at the same energy will be the same, the difference being that at the greater level of carbon ions/cm$^2$ there is more carbon implanted and so the curve goes higher. A second carbon beam at a different energy level is aimed into the titanium alloy sample after the desired level of carbon ions/cm$^2$ is achieved from the first beam at the first energy level. A second energy level can be, for example, 75 KeV with a current, for instance at 20 microamps being maintained until $7 \times 10^{17}$ carbon ions/cm$^2$ are implanted. The actual carbon level versus depth of titanium alloy is similar to curve C of FIG. 1 with the maximum carbon concentration roughly doubled. What makes this second method important is the unique and unobvious result that when the greater levels of carbon ions/cm$^2$ are used, TiC precipitates form in a similar distribution and size to the TiC precipitates that form during the first method when 400° heating for 1 hour is used.

One particular embodiment that is possible out of a great many embodiments that are advantageous is now described. It should in no way be construed that this invention is limited to the one embodiment henceforth described.

A flat, polished sample of Ti-6Al-4 V alloy is placed into an ion implanter. A carbon monoxide gas is used as the source for the carbon monoxide plasma wherefrom the carbon ions for the carbon ion beam originate. A 20 microampere current is applied to the titanium alloy sample at both energy levels used. The first energy level used is 175 KeV and the current containing the carbon atoms with this energy is maintained until $3 \times 10^{17}$ carbon ions/cm$^2$ have fallen upon the titanium sample. The second energy level used is 75 KeV and the current containing the carbon atoms with this energy is maintained until $2 \times 10^{17}$ carbon ions/cm$^2$ have fallen upon the titanium sample.

The titanium sample is then cleaned with acetone and placed into a ultra-high vacuum furnace. The vacuum furnace is pumped down to $2 \times 10^{-9}$ Torr. The furnace is then heated to 400° C. for 1 hour. The titanium is then allowed to cool.

Obviously, numerous (additional) modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A method for producing titanium alloys more resistant to sliding wear and fretting fatique then heretofor known comprising the steps of:
   implanting carbon ions at a first energy level which is greater than 10 KeV onto a titanium alloy until at least $1 \times 10^{17}$ carbon ions/cm$^2$ have fallen onto the titanium alloy;
   implanting carbon ions with at least a second energy level which is greater than 10 KeV having a minimum of 20 KeV difference from the first energy level onto the titanium alloy that has been implanted at the first energy level until at least $1 \times 10^{17}$ carbon ions/cm$^2$ have fallen onto the titanium alloy in this second step;
   placing the titanium alloy which has been implanted with carbon ions with at least two energy levels having a 20 KeV difference into an ultra-high vacuum furnace;
   evacuating the vacuum furnace; and
   heating the implanted titanium alloy in the vacuum furnace at a temperature of between 300° C. to 500° C. for a period of time between 0.5 hours and 2 hours.

2. A method for producing titanium alloy more resistant to sliding wear and fretting fatigue than heretofor known comprising the steps of:

implanting carbon ions at a first energy level which is greater than 10 KeV onto a titanium alloy until at least $5 \times 10^{17}$ carbon ions/cm$^2$ are implanted onto the titanium alloy; and implanting carbon ions with at least a second energy level which is greater than 10 KeV having a minimum of 20 KeV difference from the first energy level onto the titanium alloy that has been implanted at the first energy level until at least $5 \times 10^{17}$ carbon ions/cm$^2$ are implanted onto the titanium alloy in this second step.

3. A method as described in claim 1 wherein:

during the implanting step at a first energy level the energy level of the carbon ions being implanted is between 50 and 100 KeV; and during the implanting step with at least a second energy level, the energy level of the carbon ions being implanted is between 150 and 200 KeV.

4. A method as described in claim 2 wherein:

during the implanting step at a first energy level the energy level of the carbon ions being implanted is between and 100 KeV; and during the implanting step with at least a second energy level, the energy level of the carbon ions being implanted is between 150 and 200 KeV.

5. A method as describe in claim 1 wherein:

during the implanting step at a first energy level carbon ions are implanted onto the titanium alloy until between $1.0 \times 10^{17}$ carbon ions/cm$^2$ and $4 \times 10^{17}$ carbon ions/cm$^2$ are implanted onto the titanium alloy; and during the implanting step with at least a second energy level, carbon ions are implanted onto the titanium alloy until between $1.0 \times 10^{17}$ carbon ions/cm$^2$ and $4 \times 10^{17}$ carbon ions/cm$^2$ are implanted onto the titanium alloy.

6. A method as described in claim 3 wherein:

during the implanting step at a first energy level carbon ions are implanted onto the titanium alloy until between $1.0 \times 10^{17}$ carbon ions/cm$^2$ and $4 \times 10^{17}$ carbon ions/cm$^2$ are implanted onto the titanium alloy; and during the implanting step with at least a second energy level, carbon ions are implanted onto the titanium alloy until between $1.0 \times 10^{17}$ carbon ions/cm$^2$ and $4 \times 10^{17}$ carbon ions/cm$^2$ are implanted onto the titanium alloy.

7. A method for producing titanium alloy more resistant to sliding wear and fretting fatigue then heretofor known comprising the steps of:

implanting carbon ions at a first energy level which is between 50 and 100 KeV onto a titanium alloy until at least $1 \times 10^{17}$ carbon ions/cm$^2$ have fallen onto the titanium alloy; implanting carbon ions with at least a second energy level which is between 150 and 200 KeV onto the titanium alloy that has been implanted at the first energy level until at least $1 \times 10^{17}$ carbon ions/cm$^2$ have fallen onto the titanium alloy in this step;

placing the titanium alloy which has been implanted with carbon ions with at least two energy levels having a 50 KeV difference into a ultra-high vacuum furnace;

evacuating the vacuum furnace; and heating the implanted titanium alloy in the vacuum furnace at a temperature of between 300° C. to 500° C. for a period of time between 0.5 hours and 2 hours.

* * * * *